United States Patent [19]
Redlich

[11] Patent Number: 5,592,073
[45] Date of Patent: Jan. 7, 1997

[54] TRIAC CONTROL CIRCUIT

[75] Inventor: Robert W. Redlich, Athens, Ohio

[73] Assignee: Sunpower, Inc., Athens, Ohio

[21] Appl. No.: 454,635

[22] Filed: May 31, 1995

[51] Int. Cl.$^6$ ........................................................ G05F 5/00
[52] U.S. Cl. ............................................. 323/300; 327/452
[58] Field of Search ..................................... 323/237, 241,
323/300; 327/18, 36, 37, 164, 170, 175,
176, 184, 451, 452, 476

[56] References Cited

U.S. PATENT DOCUMENTS

| | | | |
|---|---|---|---|
| 4,362,988 | 12/1982 | Weimer | 324/62 |
| 4,977,877 | 12/1990 | Dykstra | 123/335 |
| 5,194,782 | 3/1993 | Richardson et al. | 315/291 |
| 5,270,698 | 12/1993 | Hoyle et al. | 340/815.01 |
| 5,450,521 | 9/1995 | Redlich | 388/829 |
| 5,471,360 | 11/1995 | Ishikawa et al. | 361/154 |

OTHER PUBLICATIONS

Harris Semiconductor "Linear & Telecom ICs", 1991, pp. 8-126–8-127.
National Semiconductor, "Special Purpose Linear Devices", 1989, pp. 9-33.
Ramshaw, R. S., "Power Electronics Semiconductor Switches", Chapman and Hall, 1993, p. 198.

*Primary Examiner*—Matthew V. Nguyen
*Attorney, Agent, or Firm*—Frank H. Foster; Kremblas, Foster, Millard & Pollick

[57] ABSTRACT

A common and inexpensive integrated 555 timing circuit is used to vary the timing of triac firing pulses in response to a control voltage. A trigger pulse generator generates a pulse at each zero cross-over of an AC line. This pulse initiates a variable, one shot pulse generator which generates a rectangular pulse. The rectangular pulse terminates following a time interval which is controlled by the magnitude of a control input signal. A pulse forming circuit generates a triac firing pulse at the termination of the rectangular pulse from the one shot pulse generator.

12 Claims, 5 Drawing Sheets

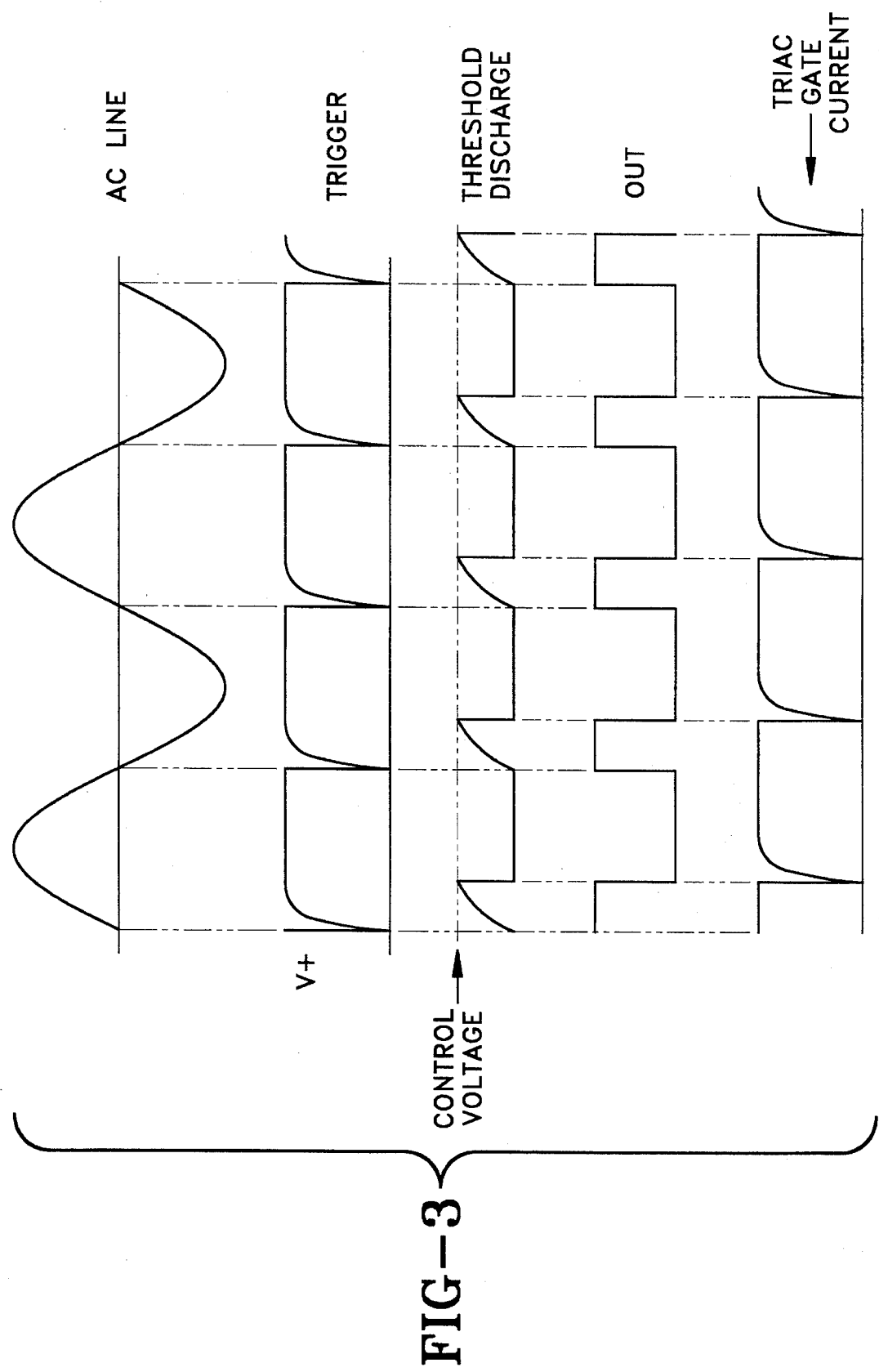

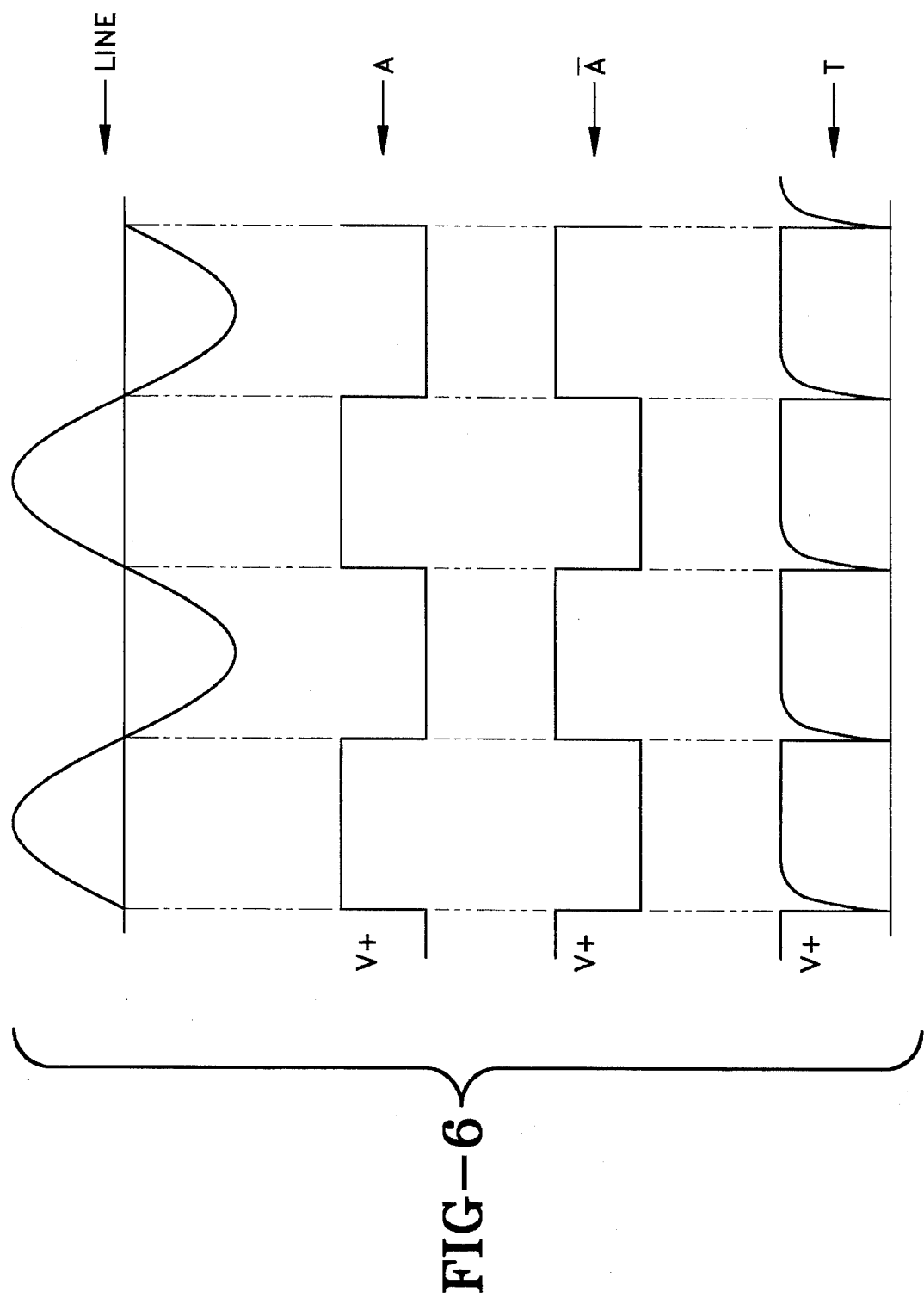

TRIAC CONTROL CIRCUIT

TECHNICAL FIELD

This invention is an electronic circuit for firing a triac at a controllably variable firing angle following each zero crossover of an AC power waveform.

BACKGROUND ART

Triacs are semiconductor devices used to control the power taken by an electrical load from an AC line. They are found in many common applications such as light dimmers and motor speed controls for power tools. A triac is practically an open circuit until it receives a pulse of current into its "gate" terminal, whereupon it becomes practically a short circuit until the current flowing between its "main terminals" reaches zero, when it reverts to an open circuit and remains open until another pulse of gate current occurs.

If a triac is connected in series between an electrical load and an AC line, the load is connected to the line when the triac is a short circuit. During the part of the cycle when the triac is an open circuit, the load is practically disconnected from the line. If the load is resistive, the triac enters its open circuit state when the line voltage and load current are both zero. For inductive loads such as motors, current reaches zero at some determinate time after line voltage crosses zero. Therefore, for resistive or combined resistive and inductive loads, it is possible to control load power by controlling the timing of gate current pulses relative to zero crossings of the AC line.

In light dimmers or power tool speed controls, changing the gate pulse timing is done by manual adjustment of a potentiometer. There are, however, triac applications, such as automatic control of a motor, where gate pulse timing must change in response to a control voltage. The present invention is an inexpensive circuit useful for such applications. Circuits for the same purpose are known in the prior art, for example as shown in Ramshaw, R. S., "Power Electronics Semiconductor Switches", Chapman and Hall, 1993, pg. 198. However, the present invention offers significant reductions in cost and component count by using, in combination with other circuitry, a well known integrated circuit, the 555 timer, which, in a single low-cost package, has most of the functional circuit blocks necessary for triac pulse timing in response to a control voltage.

The 555 timer is described in several references which have been cited in an information disclosure statement. It is produced by many major semiconductor manufacturers in the U.S. and overseas. Each manufacturer's 555 part number is different (i.e., LM555 (National Semiconductor), MC1555 (Motorola), CA555 (Harris Semiconductor), NE555 (Texas Instrument), but all are nominally identical devices. Therefore, the term "555 timer circuit" is used to designate a circuit having the same components at the block diagram level and not the part number of the particular circuit. 555 timers are used in mass produced circuits such as refrigerator defrost cycle timers and are therefore readily available at low cost. Additionally, multiple 555 timer circuits are integrated in a single chip, such as 556 timer circuits which include two 555 timer circuits. Another advantage of the 555 timer circuit in applications of the present invention is that, being an existing device, it can be incorporated with relative ease into an application specific or custom fabricated integrated circuit in which it would be one part of an integrated control system. Still another advantage is the ability of the 555 output circuit to source or sink enough current to fire large triacs.

BRIEF DISCLOSURE OF INVENTION

The invention is a triac control circuit for generating triac firing pulses which are spaced from each other by a time interval equal to one-half the period of an AC line waveform. The time interval between zero crossover of the AC line signal and the next triac firing pulse is controllable by the magnitude of a control signal. A trigger pulse generator circuit has its input connected to the AC line and generates a pulse at the trigger pulse generator output at the time of each zero crossover of the AC line. A variable, one shot, pulse generator circuit has its trigger input connected to the output of the trigger pulse generator and generates a rectangular pulse at the one shot output, which is initiated by the pulse from the trigger pulse generator circuit. The rectangular pulse terminates following a time interval which is controlled by the magnitude of the control signal applied to the control input of the one shot pulse generator circuit. A pulse forming circuit is connected to the output of the one shot pulse generator circuit and includes a high pass filter and diode. This pulse forming circuit forms a triac firing pulse at the termination of the rectangular pulse.

BRIEF DESCRIPTION OF DRAWINGS

FIG. 3 is a series of oscillograms showing waveforms of voltage and current at significant locations in the circuit of FIG. 1.

FIG. 6 is a series of oscillograms showing waveforms of voltage at significant locations in the circuits of FIGS. 4 and 5.

Figure 1:
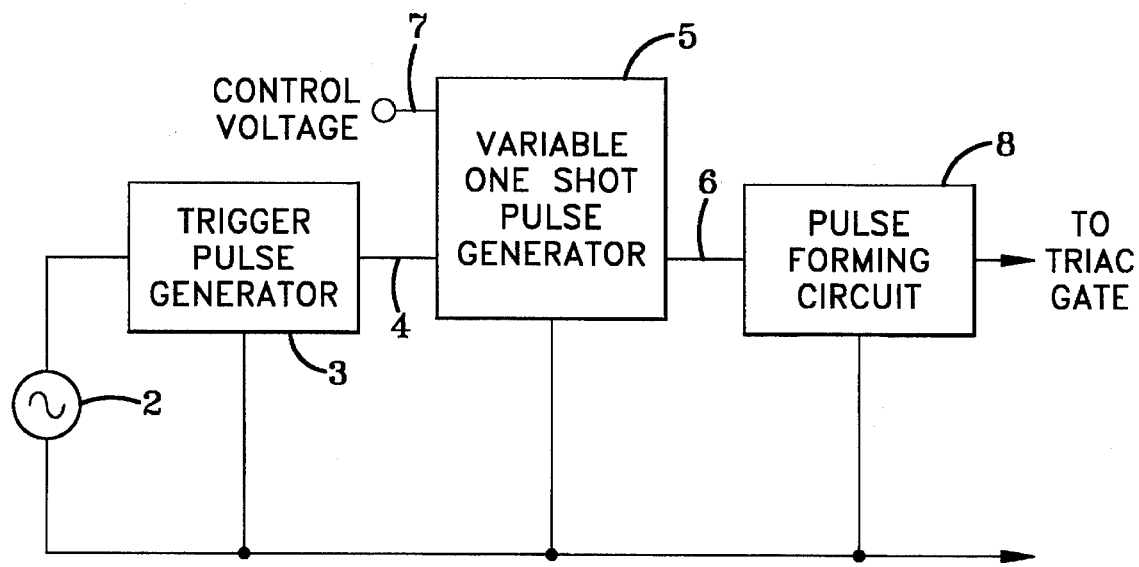
FIG. 1 is a simplified block diagram of the elemental components of the invention.

In describing the preferred embodiment of the invention which is illustrated in the drawings, specific terminology will be resorted to for the sake of clarity. However, it is not intended that the invention be limited to the specific terms so selected and it is to be understood that each specific term includes all technical equivalents which operate in a similar manner to accomplish a similar purpose. For example, the word connected or terms similar thereto are often used. They are not limited to direct connection but include connection through other circuit elements where such connection is recognized as being equivalent by those skilled in the art. In addition, many circuits are illustrated which are of a type which perform well known operations on electronic signals. Those skilled in the art will recognize that there are many, and in the future may be additional, alternative circuits which are recognized as equivalent because they provide the same operations on the signals.

DETAILED DESCRIPTION

FIG. 1 is a simple block diagram illustrating the principal components of the invention. An AC power source 2, such as a service line from a commercial power company, is applied to a trigger pulse generator circuit 3. The trigger pulse generator circuit 3 generates a pulse at its output for each zero cross-over of the AC line signal of the source 2. The output of the trigger pulse generator 3 is applied to the trigger input 4 of a variable one shot pulse generator 5. Each trigger pulse from the trigger pulse generator 3, which occurs at the zero cross-overs of the AC line source 2, initiates a rectangular pulse at the output 6 of the variable one shot pulse generator 5. The duration of the output pulse from the pulse generator 5 is a variable function of the magnitude of a control voltage signal applied to a control input 7 of the variable one shot pulse generator 5. Consequently, the one shot output pulse terminates following a time interval which is controlled by the magnitude of the control voltage at the input 7. The output pulse from the variable one shot pulse generator 5 is applied to the input of a pulse forming circuit 8. The pulse forming circuit 8 has a high pass filter and diode for applying a triac firing pulse of relatively brief duration to the gate of a triac during each negatively directed transition of the output pulse from the one shot pulse generator 5.

Figure 2:
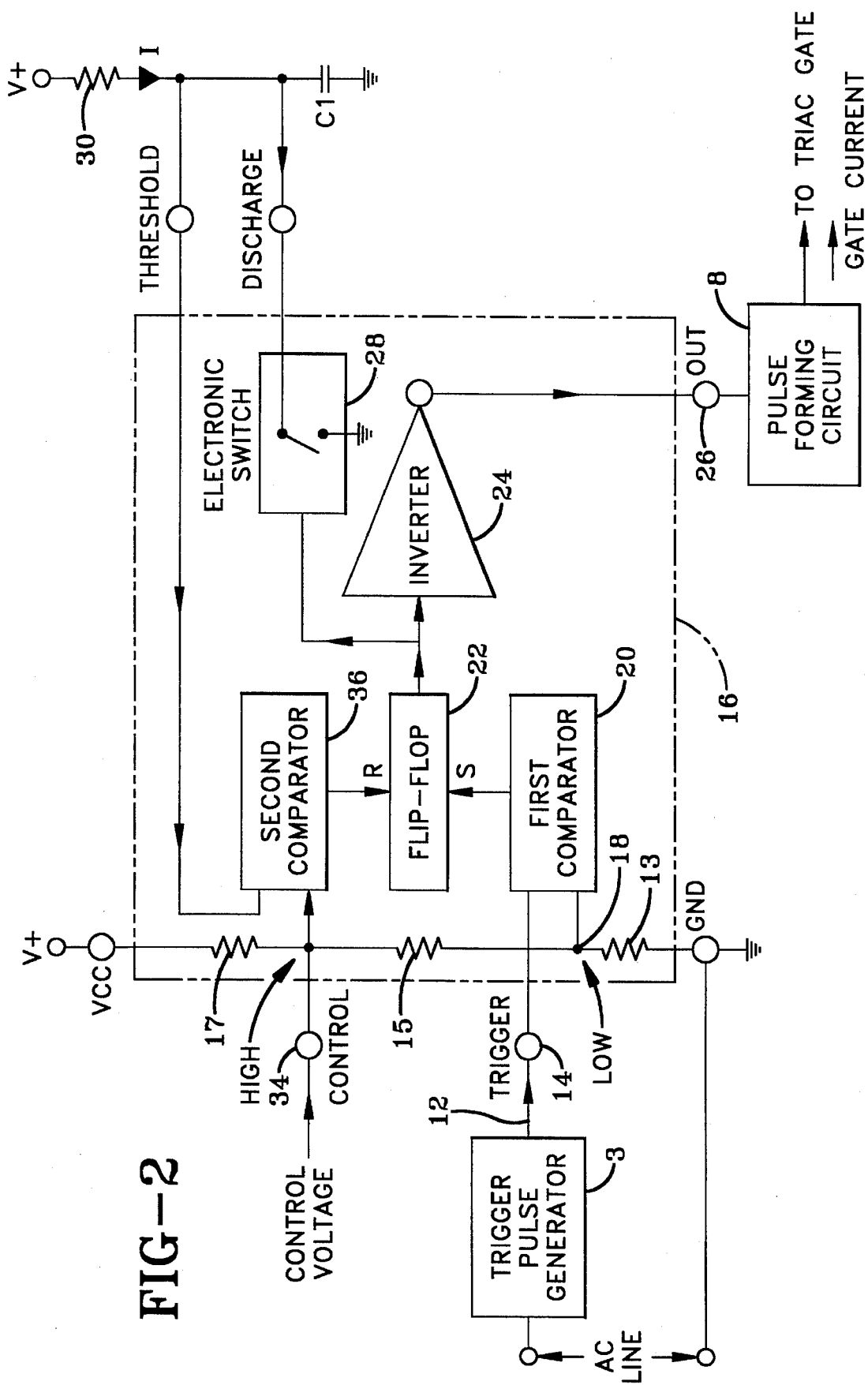
FIG. 2 is a more detailed block diagram of the invention. The terminals VCC, Control, Trigger, out, threshold, discharge, and ground are labelled with the same designations given to terminals of the commercially available 555 timer circuits. The blocks "first comparator", "second comparator", "flip-flop", "inverter", "electronic switch" are all subcircuits of the 555 timer. The three resistors are also part of the 555 integrated circuit.

FIG. 2 illustrates the trigger pulse generator component 3 and pulse forming circuit 8, combined with a variable one shot pulse generator circuit formed by a 555 timer circuit, its attached capacitor C1 and a suitable charging circuit for the capacitor C1.

The trigger pulse generator circuit 3 has an output 12 connected to the trigger input 14 of the 555 timer circuit 16. The 555 timer circuit 16 includes three resistors 13, 15 and 17 connected in series between ground GND and a positive power supply terminal VCC. The output 12 of the trigger pulse generator 3 is made to fall below the voltage at the "low" node 18 each time the AC line voltage crosses zero. At those times, the first comparator 20, connected to set input S, sets the flip flop 22 output low (i.e. at or near ground), which causes the inverter 24 to drive the 555 timer output terminal 26 high, that is, to a voltage at or near V+, which is the positive DC supply voltage VCC, and also causes the electronic switch 28 to open. Capacitor C1, which had been short circuited by the electronic switch 28, then charges as a result of current I flowing into it. If current I is the current through a resistor 30 connected between V+ and capacitor C1, then capacitor C1 charges exponentially. Alternatively, if current I is the output of an electronic constant current source, then C1 charges linearly. When capacitor C1 charges to a voltage which just exceeds the voltage at the high node 32, which voltage is the same as the control voltage applied to the control input 34 to the 555 timer circuit, then the second comparator 36, connected to reset input R resets the flip-flop 22 output high, which causes the electronic switch 28 to close and discharge capacitor C1 and also causes output 26 to go low. Nothing more happens until the trigger input 14 voltage again falls below the voltage at the "low" node 18, at which time the cycle just described repeats itself.

The pulse forming circuit 8 of FIGS. 1 and 2 generates a firing pulse of current out of the triac gate when the 555 timer output 26 goes from high to low. The time between a zero crossing of the AC line and the next firing pulse is the time required for capacitor C1 to charge to a voltage equal to the control voltage, and thus can be varied by changing the control voltage, thereby fulfilling the control function of the invention.

Waveforms in FIG. 3 are referenced to voltages and currents at locations specified in FIG. 2. At the zero crossings of the AC line voltage, the trigger pulse generator 3 causes the voltage at trigger input 14 to fall from V+ to near ground, i.e., to a voltage below that at the "low" node 18. Trigger 14 voltage must remain below "low" node 18 voltage for at least 50 nanoseconds for reliable operation of the first comparator 20. If trigger 14 voltage is still below "low" node 18 voltage when the flip-flop 22 is reset high by the second comparator 36, the flip-flop 22 will immediately be set low by the first comparator 20 and a false charging cycle would be initiated, resulting in spurious, mistimed firing pulses. Since the maximum possible time between a line voltage zero crossing and a flip-flop reset is one-half of the line voltage period, trigger input 14 cannot, under any circumstances, remain below "low" for more than one-half of the line voltage period. In practice, trigger input 14 will remain below "low" for only a few microseconds, which imposes a definite restriction on the minimum time that firing pulses can be delayed from line zero-crossings. However, for typical line periods of 16000 microseconds, this restriction is practically insignificant.

The triac gate current shown in FIG. 3 is negative, i.e., out of the triac gate. Most triacs will fire with either positive or negative gate current, but negative gate current can be generated at a downward transition with fewer components than can positive current.

Figure 4:
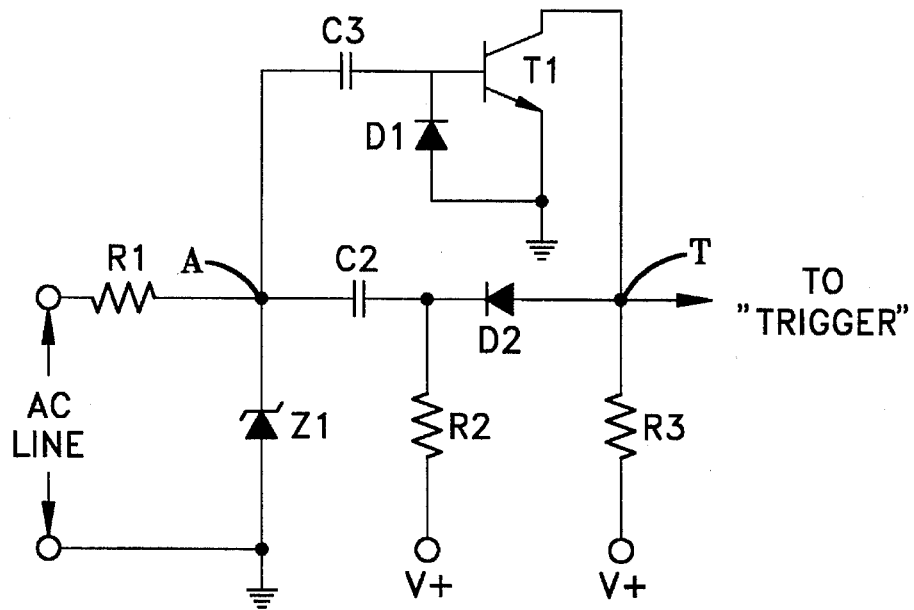
FIG. 4 and FIG. 5 are specific circuits, either of which can be used for the functional block "Trigger Pulse Generator" of FIG. 1.

FIG. 4 is an embodiment of trigger pulse generator circuit 3 that has a low component count and, with the exception of capacitors, can be incorporated into an application specific integrated circuit to form part of an integrated control system of which a 555 timer circuit is another subcircuit. Resistor R1 and zener diode Z1 form a voltage limiting circuit to rectify and clip the AC line voltage to form a positive rectangular wave at node A that transitions between ground minus one diode drop and the zener voltage, which is made nominally equal to V+. Typical rise and fall times at node A are about 200 microseconds for a 120 volt, 60 hz. line and 12 volt zener voltage.

A pulse forming circuit including a high pass filter and diode is formed by capacitor C2, resistor R2, and diode D2 which pull the voltage at trigger input 14 down to near ground at the negative transitions of A. The voltage at trigger input 14 is normally held at V+ by pull up resistor R3. A similar pulse forming circuit is formed by capacitor C3, diode D1 and transistor T1 which together form an inverting second high pass filter and diode. At the positive going transitions of node A, capacitor C3 charges through the base of transistor T1 and turns it on, thereby pulling trigger input 14 down to near ground. Diode D1 discharges capacitor C3 after each positive transition of A. Thus, the trigger input 14 voltage falls below the voltage at "low" node 18 at each zero crossing of the AC line, as required.

Figure 5:
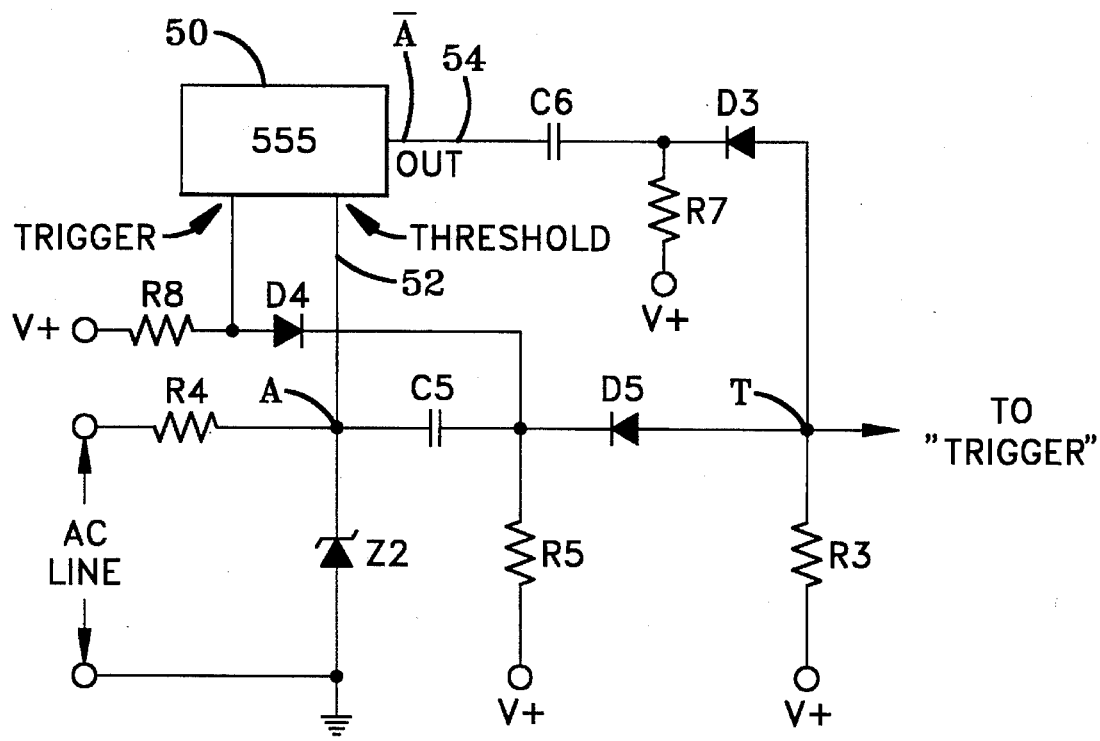

FIG. 5 shows another embodiment of a pulse generator circuit 3 which uses a 555 timer circuit 50 as part of a circuit that generates a trigger pulse at the positive transitions of A. The 555 timer circuit 50 is connected to operate as an inverter inverting the rectangular waveform at node A to the rectangular waveform at $\overline{A}$. This 555 timer circuit 50 can be one-half of a common integrated circuit consisting of two identical 555 timer circuits in a single package, and which has a part number differing between manufacturers but generally includes the number 556, e.g., LM556, NE566. Thus, the 555 timer circuit 16 of FIG. 2 and the 555 timer circuit 50 of FIG. 5 can be in the same integrated 556 circuit.

In the circuit of FIG. 5, resistor R4, zener diode Z2, capacitor C5, resistor R5, diode D5, and capacitor C6 perform the same functions as in the circuit of FIG. 4, that is, they provide a voltage limiter circuit followed by a pulse forming circuit having a high pass filter and diode in order to generate a trigger pulse at the negative transitions of A. To generate a trigger pulse at the positive transitions of A, the inverse of A labelled $\overline{A}$ in FIG. 5, is first generated by the 555 circuit 50. This is done by applying the voltage at node A to the threshold input 52 of the 555 circuit 50 and triggering the 555 circuit 50 at the negative transitions of A by means of resistor R8 and diode D4. A trigger pulse on the negative transitions of the 555 output 54 is formed by capacitor C6, resistor R7, and diode D3 which provide a pulse forming circuit having a high pass filter and diode. The circuit of FIG. 5 can be incorporated with relative ease into an application specific integrated circuit. All the components except capacitors C5 and C6 can be integrated. Waveforms at nodes A and $\overline{A}$, and trigger output node T are shown in FIG. 6.

Figure 7:
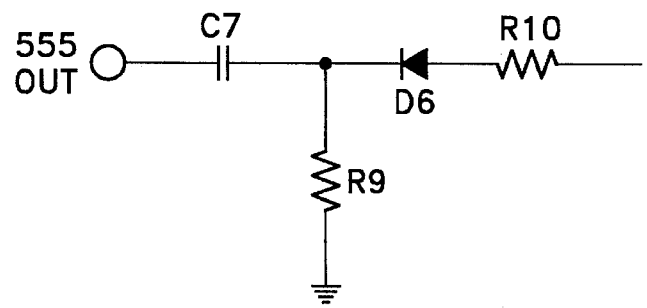
FIG. 7 is a specific circuit which can be used for the functional block "pulse forming circuit" of FIG. 1.

FIG. 7 shows a circuit that will perform the function of the pulse forming circuit 8 of FIG. 1 by generating a pulse of current out of a triac gate at the downward, negative going transitions of the output 26 of 555 timer circuit 16. Diode D6 blocks pulses at positive transitions of output 26, resistor R10 limits triac gate current, and resistor R9 and capacitor C7 control pulse duration.

While certain preferred embodiments of the present invention have been disclosed in detail, it is to be understood that various modifications may be adopted without departing from the spirit of the invention or scope of the following claims.

I claim:

1. A triac control circuit for generation of triac firing pulses spaced in time by one-half the period of an AC line signal, the time interval between zero crossing of the AC line signal and the next firing pulse being controllable by a control signal magnitude, the circuit comprising:

(a) a trigger pulse generator circuit having an input connected to the AC line and generating a pulse at a generator output at each zero crossover of the AC line signal;

(b) a variable, one shot, pulse generator circuit having a trigger input connected to the output of the trigger pulse generator circuit and generating a pulse at a one shot output which is initiated by a pulse from the trigger pulse generator circuit and terminates following a time interval which is controlled by the magnitude of a control signal applied to a control input; and (c) a pulse forming circuit including a high pass filter and diode and connected to the one shot pulse generator circuit output for forming a triac firing pulse at the termination of the one shot pulse generator circuit output pulse.

2. A triac control circuit in accordance with claim 1 wherein the trigger pulse generator circuit more particularly comprises:

(a) a voltage limiter circuit having its input connected to the AC line for converting a substantially sinusoidal AC line signal to a rectangular waveform signal at its output;

(b) a pulse forming circuit including a high pass filter and diode and having an input connected to the limiter circuit output and an output connected to the trigger input of the one shot pulse generator circuit to form trigger pulses at negative going transitions of the rectangular waveform signal; and (c) an inverting pulse forming circuit including a high pass filter and diode and having an output connected to the trigger input of the one shot pulse generator circuit and an input connected to the output of the limiter circuit for inverting and forming trigger pulses at positive going transitions of the rectangular waveform signal.

3. A triac control circuit in accordance with claim 1, wherein the variable, one shot pulse generator circuit comprises:

(a) a 555 integrated timer circuit having a discharge terminal and a threshold terminal and a ground terminal connected to ground;

(b) a capacitor, having a first terminal connected to ground and a second terminal connected to both the discharge terminal and the threshold terminal;

(c) a source of charging current connected to the second terminal of the capacitor for charging the capacitor.

4. A triac control circuit in accordance with claim 3 wherein the trigger pulse generator circuit more particularly comprises:

(a) a voltage limiter circuit having its input connected to the AC line for converting a substantially sinusoidal AC line signal to a rectangular waveform signal at its output;

(b) a first pulse forming circuit including a high pass filter and diode and having an input connected to the limiter circuit output and an output connected to the trigger input of the one shot pulse generator circuit for forming trigger pulses of one polarity from negative going transitions of the rectangular waveform signal; and (c) a second pulse forming circuit including a high pass filter, diode and inverter circuit having an output connected to the trigger input of the one shot pulse generator circuit and an input connected to the output of the limiter circuit for inverting and forming trigger pulses of said one polarity at positive going transitions of the rectangular waveform signal.

5. A triac control circuit in accordance with claim 4 wherein the 555 integrated timer circuit is one of two duplicate 555 integrated timer circuits formed as part of the same integrated circuit, and wherein the second 555 integrated timer circuit forms the inverter circuit of the second pulse forming circuit and has a threshold input connected to the output of said voltage limiter circuit, a trigger input connected to the output of the first pulse forming circuit, and an output terminal connected to the input of the second pulse forming circuit.

6. A triac control circuit in accordance with claim 1 wherein the variable one shot pulse generator circuit comprises:

(a) a source of DC voltage having a negative terminal connected to a ground and having a positive terminal;

(b) three resistors in series connection between the DC voltage source terminals, the resistors having a high interconnection node and a low interconnection node, the high node having a more positive voltage than the low node and forming said control input;

(c) a flip-flop having set and reset inputs;

(d) a first comparator with one input connected to the low node, a second input forming said trigger input, and an output connected to the set input of the flip flop for driving the flip flop output low when the voltage at the trigger input falls below the voltage at the low node;

(e) a second comparator with one input connected to the high node, a second input forming a threshold node, and an output connected to the reset input of the flip flop for driving the flip flop output high when the voltage at the threshold input rises above the voltage at the control input;

(f) an electronic switch connected between ground and a discharge node and having a switch control terminal connected to the output of the flip flop, the switch being closed when the flip flop output is high and opened when the flip flop output is low;

(g) an inverter circuit having an input connected to the flip flop output and an output forming the one shot pulse generator circuit output;

(h) a capacitor, having a first terminal connected to ground and a second terminal connected to both the discharge node and the threshold node; and (i) a source of charging current connected to the second terminal of the capacitor for charging the capacitor.

7. A triac control circuit in accordance with claim 6, wherein the trigger pulse generator circuit more particularly comprises:

means for generating a voltage between ground and the trigger input, said voltage being more positive than the voltage at the low node except for intervals that begin at the zero crossing of the AC line signal and have a duration between 50 nanoseconds and one-half the period of the AC line signal.

8. A circuit according to claim 6, wherein the pulse forming circuit connected to the output of the one shot pulse generator circuits more particularly comprises:

(a) a series resistor and capacitor having a common interconnection node, the capacitor connected between the one shot pulse generator circuit output and a terminal of the resistor, a second terminal of the resistor being connected to ground;

(b) a diode having a cathode connected to the interconnection node between the series resistor and capacitor and having an anode; and (c) a second resistor connected to said anode and having a second terminal for connection to the triac gate.

9. A circuit according to claim 6 wherein said three series resistors, flip flop, first and second comparators, electronic switch, and inverter are all part of a single integrated circuit.

10. A circuit according to claim 6 wherein said trigger pulse generator circuit comprises:

(a) a voltage limiting circuit comprising a resistor and a zener diode connected in series across the AC line to have a first interconnection node connected to the cathode of the zener diode, the anode of the zener diode being connected to ground and to one side of the AC line, the zener voltage of the zener diode being nominally equal to the voltage of said DC source;

(b) a pulse forming circuit including a high pass filter and diode and more particularly comprising a capacitor and a resistor connected in series between said first node and the positive terminal of said DC source, one terminal of the resistor being connected to said source and the other terminal of the resistor being connected to a second interconnection node between the resistor and capacitor, the circuit further including a diode having an anode connected to the trigger input of the one shot pulse generator and a cathode connected to said second node;

(c) an inverting pulse forming circuit including a high pass filter and diode and more particularly comprising a capacitor and a diode connected in series between said first node and ground, the anode of the diode being connected to ground, the series capacitor and diode having a common interconnection node connected to the base of an NPN transistor, the emitter of said transistor being connected to ground and the collector of said transistor being connected to said trigger input; and (d) a resistor connected from said trigger input and the positive terminal of said DC source.

11. A circuit according to claim 10 wherein said diodes and said transistor are part of a single integrated circuit.

12. A method for controlling the firing angle of a triac from an AC line signal, the method comprising:

(a) initiating a timing pulse at each zero crossover of the AC line signal;

(b) terminating the timing pulse after a time interval which is proportional to the magnitude of a variable control input signal; and (c) generating a separate triac triggering pulse at the termination of the timing pulse, said triggering pulse terminating the triac gate current before the next zero crossover of the AC line signal.

* * * * *